(12) United States Patent
Kao et al.

(10) Patent No.: US 7,863,929 B1
(45) Date of Patent: Jan. 4, 2011

(54) ACTIVE BACK-END TERMINATION CIRCUIT

(75) Inventors: Min-Sheng Kao, Tucheng (TW); Yu-Hao Hsu, Xinying (TW); Jen-Ming Wu, Zhubei (TW)

(73) Assignee: National Tsing Hua University (TW)

( * ) Notice: Subject to any disclaimer, the term of this patent is extended or adjusted under 35 U.S.C. 154(b) by 0 days.

(21) Appl. No.: 12/695,773

(22) Filed: Jan. 28, 2010

(30) Foreign Application Priority Data

Jun. 11, 2009 (TW) .............................. 98119603 A

(51) Int. Cl.
*H03K 19/003* (2006.01)
(52) U.S. Cl. .......................................... 326/30; 326/33
(58) Field of Classification Search ................... 326/30, 326/21, 31, 33
See application file for complete search history.

(56) References Cited

U.S. PATENT DOCUMENTS 6,307,401 B1 * 10/2001 Bridgewater, Jr. ............ 326/86
6,667,661 B1   12/2003 Liu et al.
7,301,365 B2 * 11/2007 Chan ........................... 326/30
7,312,662 B1 * 12/2007 Roo et al. .................... 330/311

* cited by examiner

*Primary Examiner*—James Cho
(74) *Attorney, Agent, or Firm*—Thomas W. Tolpin; Tolpin & Partners, PC

(57) ABSTRACT

The invention discloses an active back-end termination circuit, which comprises a first resistor, a first transistor, a second resistor, and a second transistor. The first resistor and the first transistor are connected in series for forming a first impendence unit. A first source of the first transistor is connected to a working voltage with $V_{TT}$. The second resistor and the second transistor are connected in series for forming a second impendence unit. A second gate and a second drain of the second transistor are connected to the working voltage with $V_{TT}$. Wherein, the first impendence unit and the second impendence unit are connected in parallel. The first transistor or the second transistor is switched on through a power source, and the first transistor and the second transistor change the impedance actively for matching a load according to the voltage source.

22 Claims, 17 Drawing Sheets

| m1 Frequency=1.000GHz Impedance=61.2828 | m2 Frequency=5.000GHz Impedance=56.7781 | m3 Frequency=6.040GHz Impedance=54.8778 | m4 Frequency=7.090GHz Impedance=52.9571 | m5 Frequency=8.070GHz Impedance=51.1932 | m6 Frequency=9.050GHz Impedance=49.4708 |
|---|---|---|---|---|---|
| m7 Frequency=10.39GHz Impedance=47.1961 | | | | | |

ACTIVE BACK-END TERMINATION CIRCUIT

FIELD OF THE INVENTION

The present invention relates to an active back-end termination circuit, in particular to a DC-coupled active back-end termination circuit for matching the impedance of the load.

DESCRIPTION OF THE RELATED ART

At present, optical communication technology is the mainstream of the high-speed communication network. A direct modulation with distributed feedback (DFB) laser is generally adopted to a middle-distance of the optical communication technology, and an external modulation with DFB laser is adopted to a long-distance of the optical communication technology. As to the transmission rate, present manufacturers adopt a mature network technology in system carrier, namely a coarse wavelength division multiplexing (CWDM) technology having a primary technical specification of OC48(2.488 Gb/s)~OC192(9.953 Gb/s), and the research works will be headed to OC768(39.812 Gb/s) continually.

The traditional laser driver is designed with an open collector architecture, and uses an external matching network for driving laser diode. With the increasing operation speed of the optical communication network, the signal reflection between the laser driver and the laser diode is getting worse due to the impedance mismatch and it impacts the performance of the transmission. To solve this problem, the passive back-end termination circuit is used, but it costs 50% modulation current due to the internal resistor (Rint). In another prior art, the internal AC-coupled active back-end termination circuit disclosed in U.S. Pat. No. 6,667,661 is used, but it is very difficult to design a high quality capacitor in chip process and it occupies large area.

SUMMARY OF THE INVENTION

In view of the aforementioned problems of the prior art, the object of the present invention is to provide an active back-end termination circuit for matching the impedance of the load.

According to another object of the present invention, an active back-end termination circuit is provided, comprising a first resistor, a first transistor, a second resistor and a second transistor. The first resistor comprises a first terminal and a second terminal. The first transistor comprises a first source, a first gate and a first drain. The first gate and the first drain are connected to the second terminal, and a first matching unit is formed by connecting the first transistor and the first resistor in series. The first source is connected to a working voltage $V_{TT}$. The second resistor comprises a third terminal and a fourth terminal. The second transistor comprises a second source, a second gate and a second drain. The second source is connected to the fourth terminal, and a second matching unit is formed by connecting the second resistor and the second transistor in series. The second gate and the second drain are connected to the working voltage $V_{TT}$. The first matching unit and the second matching unit are connected in parallel by connecting the first terminal and the third terminal are connected to a circuit. The first transistor or the second transistor is applied with a bias voltage by connecting the first terminal and the third terminal to the voltage source. According to the bias voltage supplied by the voltage source is different, so that the first matching unit and the second matching unit actively change an impedance to match with a load according to the voltage source. In other word, the first transistor and the second transistor may be switch on or switch off according to the voltage source.

If the voltage source is situated at a period of a positive half cycle, the voltage source drives the first matching unit, and if the voltage source is situated at a period of a negative half cycle, the voltage source drives the second matching unit.

The voltage source outputs a voltage with output high level (VOH) or a voltage with output low level (VOL) by defining the working voltage $V_{TT}$ as an amplitude origin.

The voltage source outputs the working voltage $V_{TT}$ without any loss of DC current.

The load is a laser diode (LD) or an elector-absorption modulated laser (EML).

When the voltage source outputs a voltage with output high level (VOH) or a voltage with output low level (VOL), the first transistor or second transistor provides an impedance matching according to the bias voltage.

Another objective of the present invention is to provide an active back-end termination circuit, comprising: a first resistor, a first transistor, a second resistor and a second transistor. The first resistor comprises a first terminal and a second terminal. The first transistor comprises a first source, a first gate and a first drain, and the first drain is connected to the second terminal, and a first matching unit is formed by connecting the first resistor and the first transistor in series, and the first source is connected to the working voltage $V_{TT}$, and the first gate is connected to an external voltage source. The second resistor comprises a third terminal and a fourth terminal. The second transistor comprises a second source, a second gate and a second drain, and the second source is connected to the fourth terminal, and a second matching unit is formed by connecting the second resistor and the second transistor in series. The second drain is connected to the working voltage $V_{TT}$, and the second gate is connected to an external voltage source. The first terminal and the third terminal are connected to a circuit, such that the first matching unit and the second matching unit are connected in parallel to the circuit. The first terminal and the third terminal are connected to the voltage source, first transistor or second transistor, and a bias voltage is provided according to the voltage source and the external voltage source. Now, the first transistor and the second transistor are variable resistors for actively matching an impedance of a load.

If the voltage source is situated at a period of a positive half cycle, the voltage source drives the first matching unit, and if the voltage source is situated at a period of a negative half cycle, the voltage source drives the second matching unit.

The voltage source outputs a voltage with output high level (VOH) or a voltage with output low level (VOL) by using the working voltage $V_{TT}$ as an amplitude origin.

The voltage source outputs the working voltage $V_{TT}$ without any loss of DC current.

The load is a laser diode (LD) or an elector-absorption modulated laser (EML).

When the voltage source outputs a voltage with output high level (VOH) or a voltage with output low level (VOL), the first transistor or second transistor provides an impedance matching according to the bias voltage.

In summation of the description above, the active back-end termination circuit of the present invention has one or more of the following advantages:

(1) The active back-end termination circuit has a driving efficiency higher than the passive back-end termination circuit.

(2) The active back-end termination circuit provides the impedance matching without designing a capacitor in a chip process, and thus no large chip area is occupied by the capacitor.

(3) The active back-end termination circuit consumes no DC current when the voltage source outputs the working voltage with $V_{TT}$.

DETAILED DESCRIPTION OF THE PREFERRED EMBODIMENTS

Figure 1:
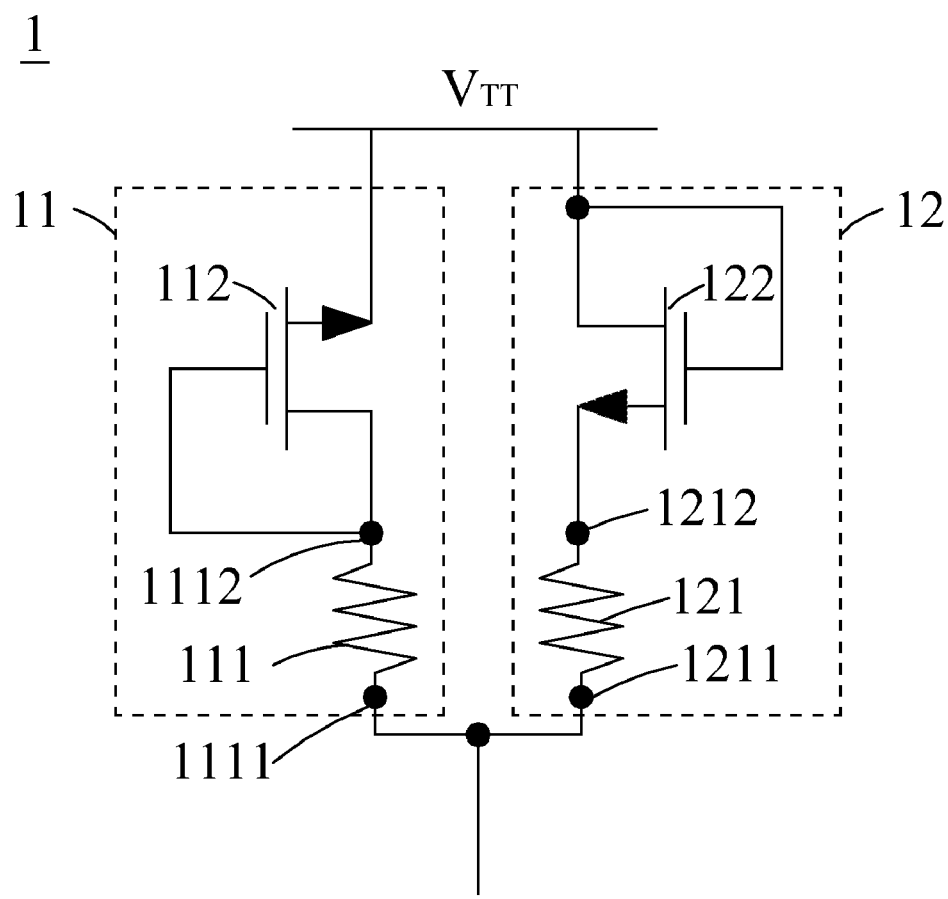
FIG. 1 is a schematic diagram of an active back-end termination circuit in accordance with the present invention.

With reference to FIG. 1 for a schematic diagram of an active back-end termination circuit in accordance with the present invention, the active back-end termination circuit 1 comprises a first matching unit 11 and a second matching unit 12. The first matching unit 11 comprises a first resistor 111 and a first transistor 112. The first resistor 111 comprises a first terminal 1111 and a second terminal 1112. The first transistor 112 comprises a first source, a first gate and a first drain, and the first gate and the first drain are connected to the second terminal 1112, such that the first resistor 111 and the first transistor 112 are connected in series, and the first source is connected to a working voltage $V_{TT}$.

The second matching unit 12 comprises a second resistor 121 and a second transistor 122. The second resistor 121 comprises a third terminal 1211 and a fourth terminal 1212. The second transistor 122 comprises a second source, a second gate and a second drain, and the second source is connected to the fourth terminal 1212, such that the second resistor 121 and the second transistor 122 are connected in series, and the second gate and the second drain are connected to the working voltage $V_{TT}$.

The first terminal 1111 and the third terminal 1211 are connected to a circuit, such that the first matching unit 11 and the second matching unit 12 are connected in parallel with a circuit. If the first terminal 1111 and the third terminal 1211 are connected to a voltage source, the first transistor 112 or the second transistor 122 generates a bias voltage according to the voltage source. If the first transistor 112 and the second transistor 122 are switched on according to the bias voltage, the resistance will be different, so that the first transistor 112 and the second transistor 122 may be considered as variable resistors for actively matching an impedance of a load. The first transistor 112 or second transistor 122 may be an N-type metal oxide semiconductor (NMOS), a P-type metal oxide semiconductor (PMOS) or a bipolar junction transistor (BJT), but the present invention is not limited to such arrangements only.

Figure 2:
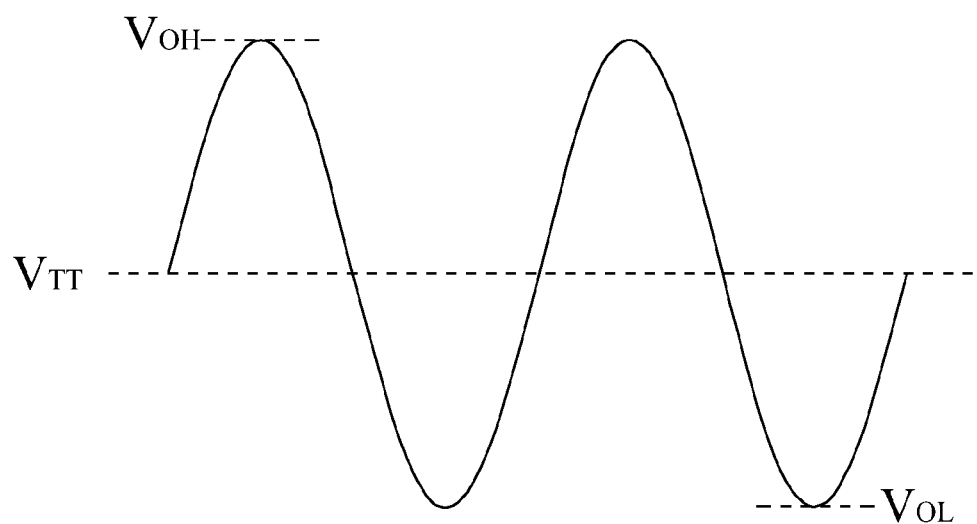
FIG. 2 is a schematic view of a sine-wave voltage source of the present invention.

The voltage source may be a periodic wave voltage source, such as a sine wave voltage source, a square wave voltage source or a triangle wave voltage source. If the voltage source is a sine wave voltage source as shown in FIG. 2, the voltage source may define the working voltage $V_{TT}$ as an amplitude origin to output a voltage with output high level (VOH) or a voltage with output low level (VOL). If the voltage source is situated at a period of a positive half cycle, the voltage source will drive the first matching unit 11. If the voltage source is situated at a period of a negative half cycle, the voltage source will drive the second matching unit 12.

Figure 3:
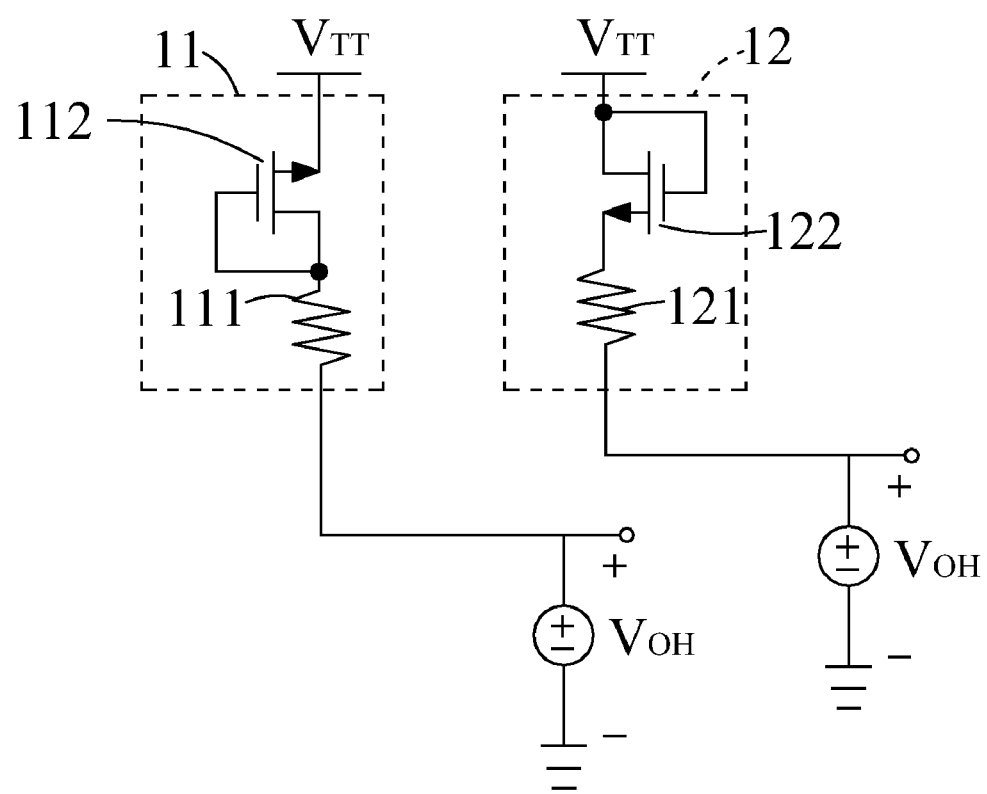
FIG. 3 is a schematic diagram of an active back-end termination circuit in accordance with a first preferred embodiment of the present invention.
Figure 4:
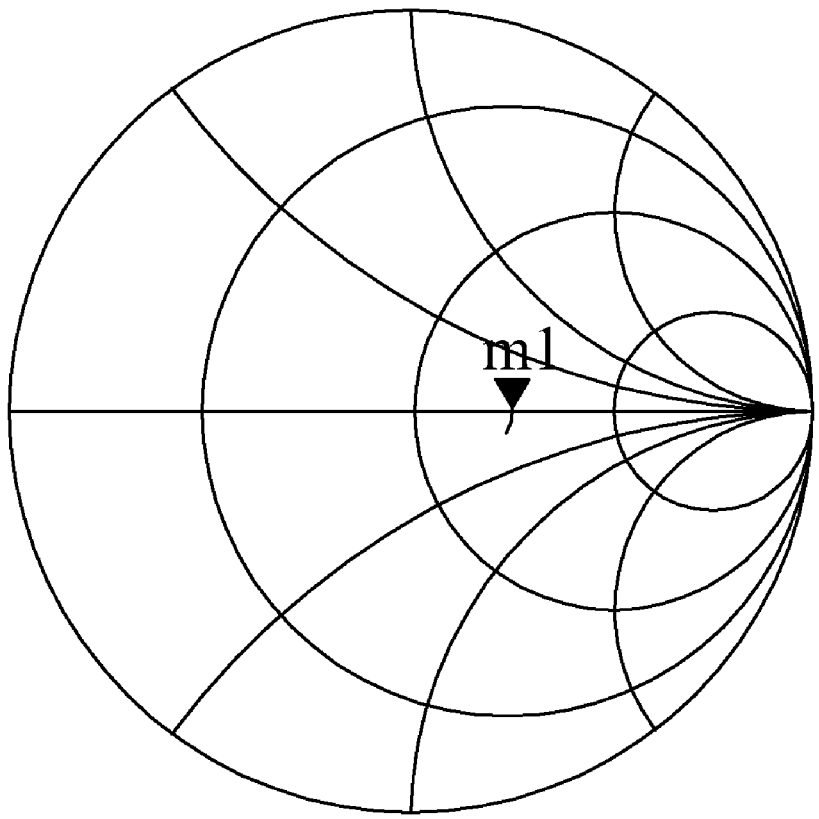
FIG. 4 is a Smith chart diagram of a first matching unit in accordance with a first preferred embodiment of the present invention.
Figure 5:
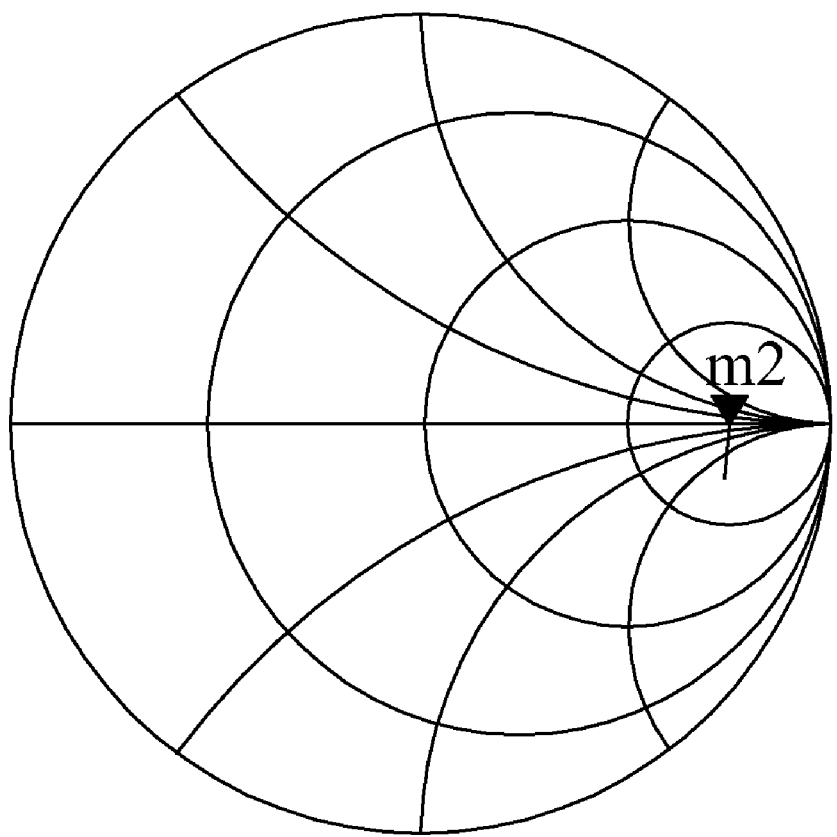
FIG. 5 is a Smith chart diagram of a second matching unit in accordance with a first preferred embodiment of the present invention.

With reference to FIG. 3 for a schematic diagram of an active back-end termination circuit in accordance with a first preferred embodiment of the present invention, FIG. 4 for a Smith chart diagram of a first matching unit in accordance with a first preferred embodiment of the present invention, and FIG. 5 for a Smith chart diagram of a second matching unit in accordance with a first preferred embodiment of the present invention respectively, if the voltage source outputs a voltage with output high level, such as a voltage value of 5V, and the operating frequency is approximately equal to 1 GHz, the first transistor 112 of the first matching unit 11 or the second transistor 122 of the second matching unit 12 will be affected by a bias voltage to obtain an impedance of 82 ohms of the first matching unit, and an impedance of 356 ohms of the second matching unit.

Figure 6:
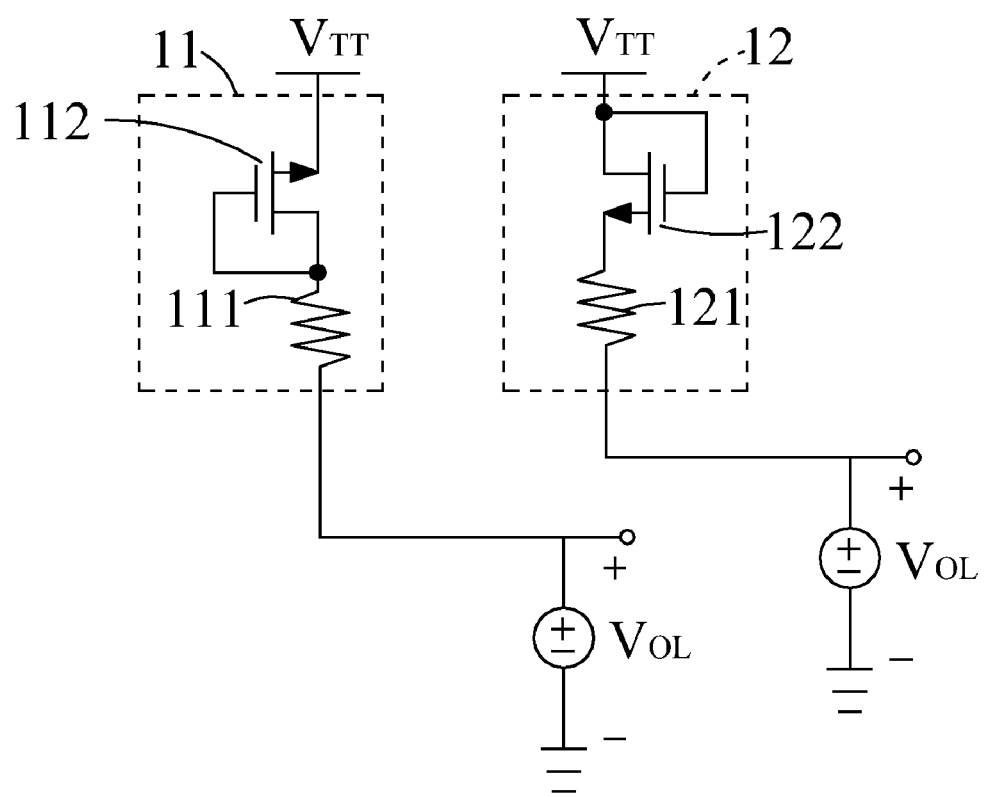
FIG. 6 is a schematic diagram of an active back-end termination circuit in accordance with a second preferred embodiment of the present invention.
Figure 7:
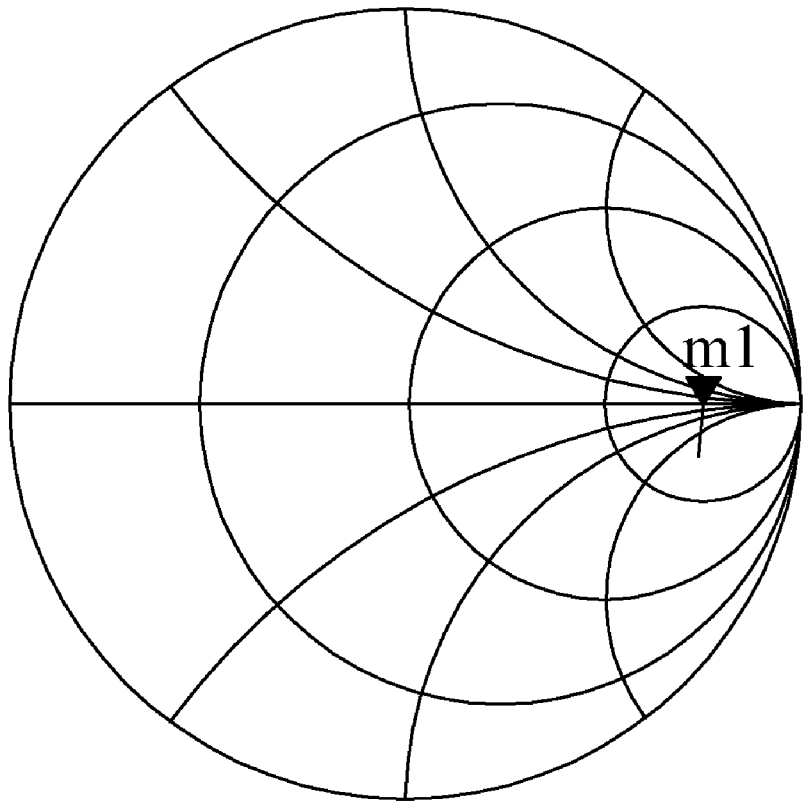
FIG. 7 is a Smith chart diagram of a first matching unit in accordance with a second preferred embodiment of the present invention.
Figure 8:
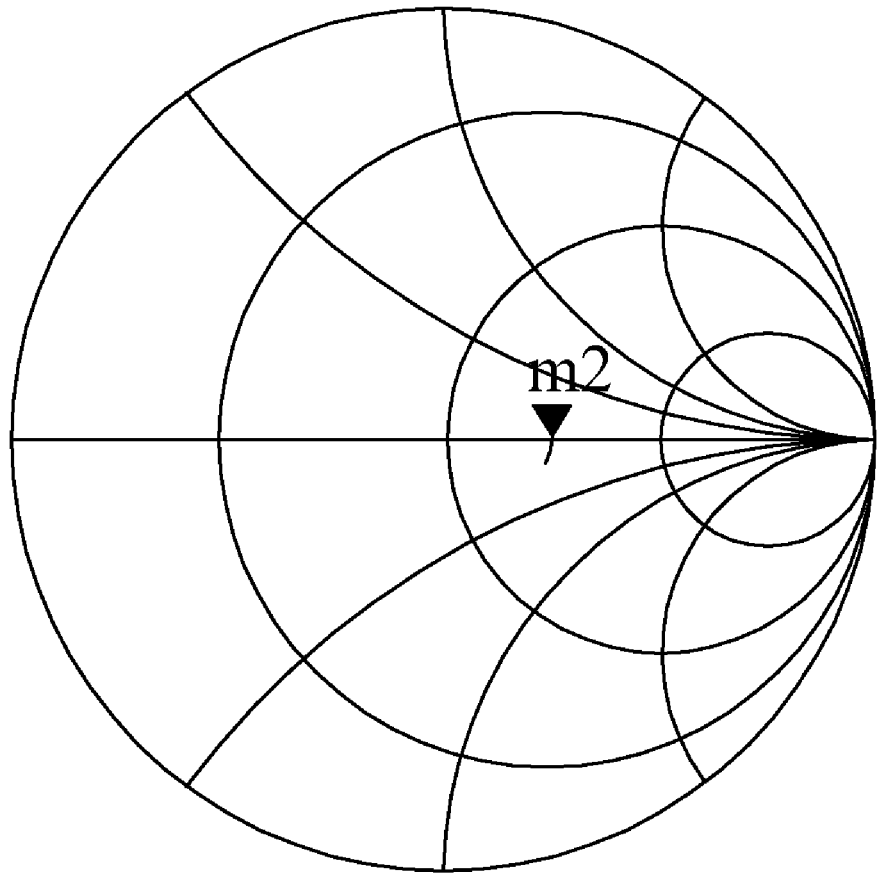
FIG. 8 is a Smith chart diagram of a second matching unit in accordance with a second preferred embodiment of the present invention.

With reference to FIG. 6 for a schematic diagram of an active back-end termination circuit in accordance with a second preferred embodiment of the present invention, FIG. 7 for a Smith chart diagram of a first matching unit in accordance with a second preferred embodiment of the present invention, and FIG. 8 for a Smith chart diagram of a second matching unit in accordance with a second preferred embodiment of the present invention respectively, if the voltage source outputs a voltage with output low level such as a voltage value of 2V, and the operating frequency is approximately equal to 1 GHz, the first transistor 112 of the first matching unit 11 or the transistor 122 of the second matching unit 12 is affected by a bias voltage to obtain an impedance of 363 ohms for the first matching unit, and an impedance of 83 ohms for the second matching unit.

In the aforementioned two preferred embodiments, if the voltage source is a voltage with output high level, an impedance of 82 ohms for the first matching unit and an impedance of 356 ohms for the second matching unit can be obtained. If the voltage source is a voltage with output low level, an impedance of 363 ohms for the first matching unit and an impedance of 83 ohms for the second matching unit can be achieved. The impendances of the whole set of matching units at a voltage with output high level or a voltage with output low level are very close and equal to 66.65 ohms and 67.56 ohms respectively.

If the voltage source is at a working voltage $V_{TT}$ such as a voltage of 3.5V, and the first source of the first transistor 112 of the first matching unit 11 is connected to the working voltage $V_{TT}$, and both terminals have an equal electric potential, there will have no loss of DC current. Similarly, the second transistor 122 of the second matching unit 12 has no loss of DC current.

Figure 9:
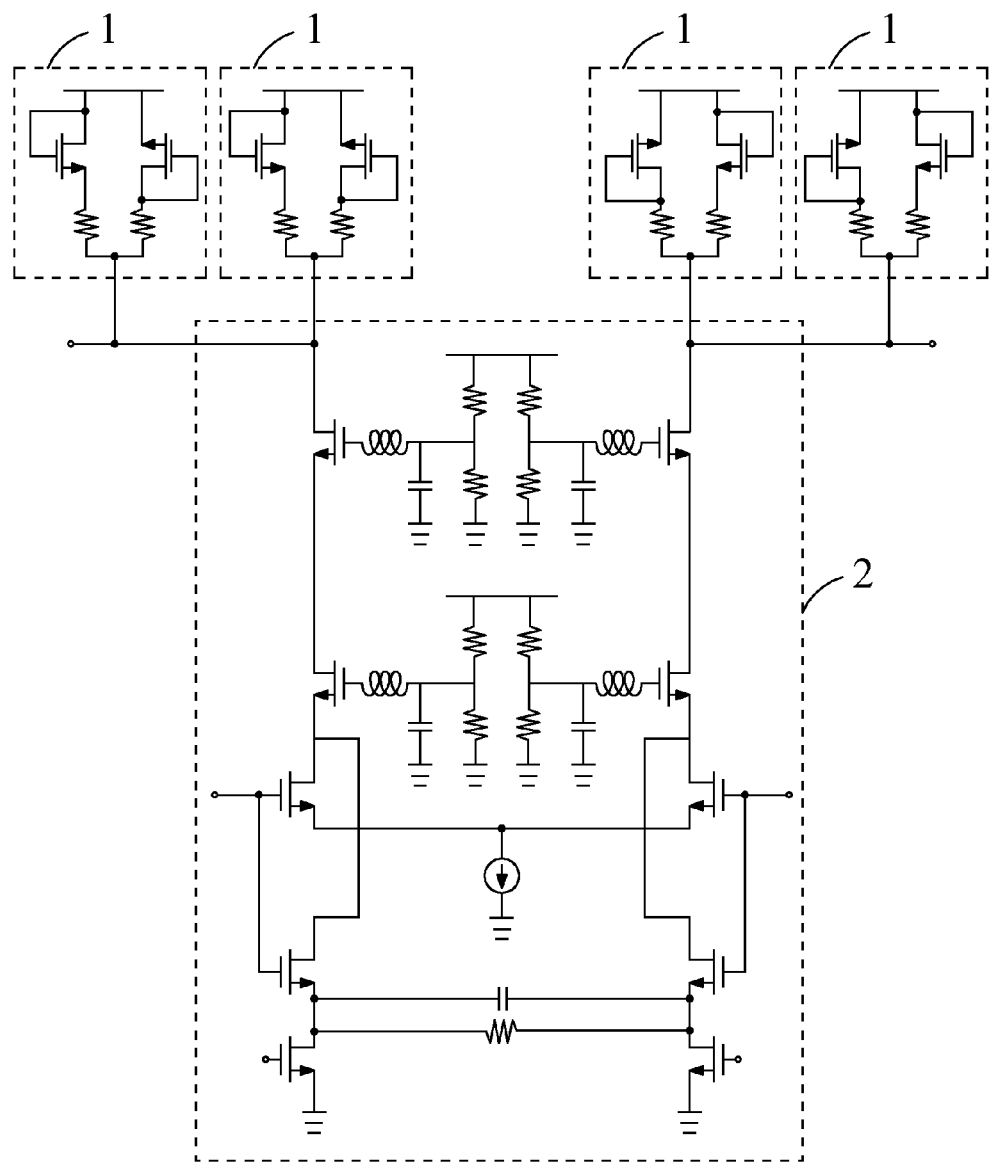
FIG. 9 is a schematic diagram of an active back-end termination circuit in accordance with a third preferred embodiment of the present invention.

With reference to FIG. 9 for a schematic diagram of an active back-end termination circuit in accordance with a third preferred embodiment of the present invention, the active back-end termination circuit 1 is connected to an output stage circuit 2 to match a load. If the load is a laser diode (LD) in 25 ohm driving system, and four sets of active back-end termination circuits may be used to match the laser diode.

Figure 10:
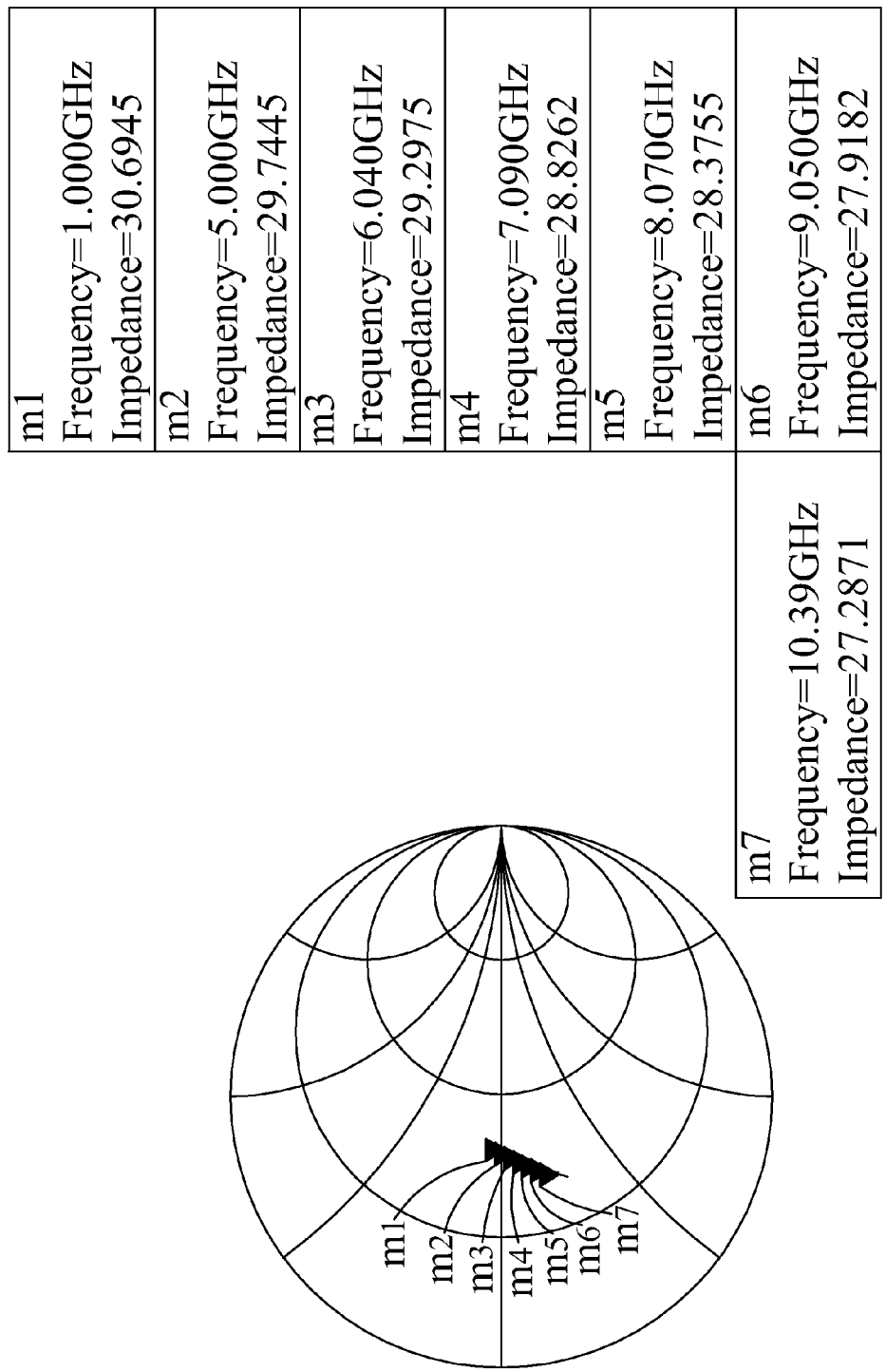
FIG. 10 is a Smith chart diagram of an active back-end termination circuit in accordance with a third preferred embodiment of the present invention.

With reference to FIG. 10 for a Smith chart diagram of an active back-end termination circuit in accordance with a third preferred embodiment of the present invention, different operating frequencies such as 1 GHz, 5 GHz, 6.04 GHz, 7.09 GHz, 8.07 GHz, 9.05 GHz and 10.39 GHz give the impedance values of 30.6945 ohms, 29.7445 ohms, 29.2975 ohms, 28.8262 ohms, 28.3755 ohms, 27.9182 ohms and 27.2871 ohms respectively, and their impedance values are very close. Therefore, the active back-end termination circuit of the present invention may provide an impedance matching.

Figure 11:
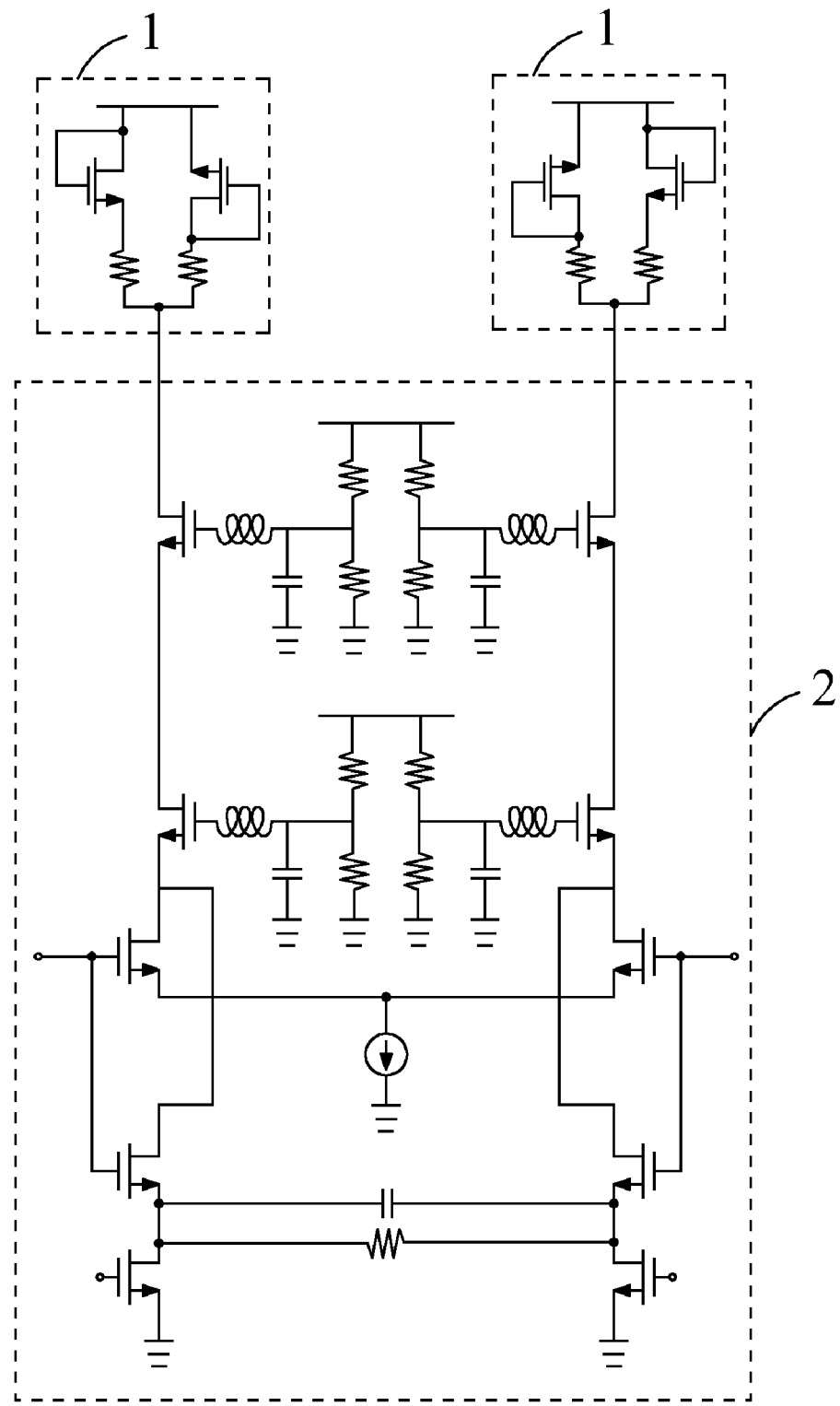
FIG. 11 is a schematic diagram of an active back-end termination circuit in accordance with a fourth preferred embodiment of the present invention.

With reference to FIG. 11 for a schematic diagram of an active back-end termination circuit in accordance with a fourth preferred embodiment of the present invention, the active back-end termination circuit 1 is connected to the output stage circuit 2 to match a load. If the load is an elector-absorption modulated laser (EML) in 50 ohm driving system, and two sets of active back-end termination circuits may be used for matching the elector-absorption modulated laser.

Figure 12:
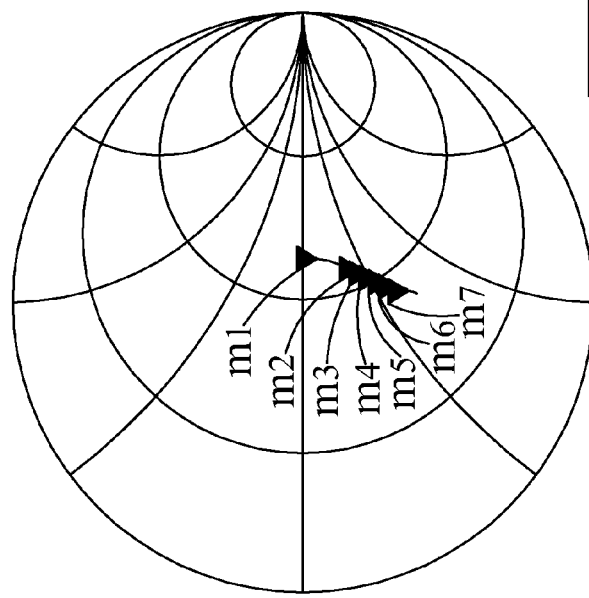
FIG. 12 is a Smith chart diagram of an active back-end termination circuit in accordance with a fourth preferred embodiment of the present invention.

With reference to FIG. 12 for a Smith chart diagram of an active back-end termination circuit in accordance with a fourth preferred embodiment of the present invention, different operating frequencies such as 1 GHz, 5 GHz, 6.04 GHz, 7.09 GHz, 8.07 GHz, 9.05 GHz and 10.39 GHz give impedance values of 61.2828 ohms, 56.7781 ohms, 54.8778 ohms, 52.9571 ohms, 51.1932 ohms, 49.4708 ohms and 47.1961 ohms respectively, and the values are very close at different frequencies, and thus the active back-end termination circuit of the present invention may provide an impedance matching.

In the present invention, the number of active back-end termination circuits may be adjusted according to the load, and the load may be a 25 ohm, 50 ohm, 75 ohm or 100 ohm driving system, but the present invention is not limited to such arrangements only.

Figure 13:
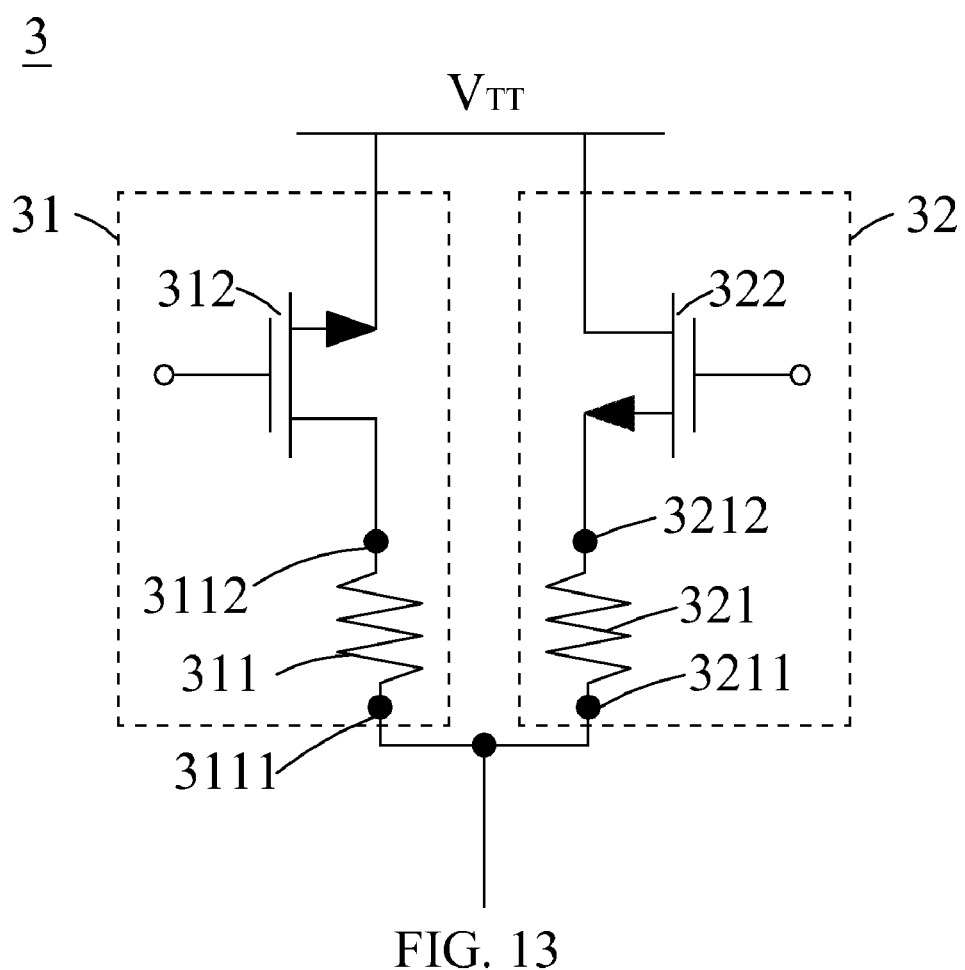
FIG. 13 is a schematic diagram of another active back-end termination circuit in accordance with the present invention.

With reference to FIG. 13 for a schematic diagram of another active back-end termination circuit in accordance with the present invention, the active back-end termination circuit 3 comprises a first matching unit 31 and a second matching unit 32. The first matching unit 31 comprises a first resistor 311 and a first transistor 312. The first resistor 311 comprises a first terminal 3111 and a second terminal 3112. The first transistor 312 comprises a first source, a first gate and a first drain, and the first drain is connected to the second terminal 3112, such that the first resistor 311 and the first transistor 312 are connected in series, and the first source is connected to a working voltage $V_{TT}$, and the first gate is connected to an external voltage source.

The second matching unit 32 comprises a second resistor 321 and a second transistor 322. The second resistor 321 comprises a third terminal 3211 and a fourth terminal 3212. The second transistor 322 comprises a second source, a second gate and a second drain, and the second source is connected to the fourth terminal 3212, such that the second resistor 321 and the second transistor 322 are connected in series, and the second drain is connected to a working voltage $V_{TT}$, and the second gate is connected to an external voltage source.

The first terminal 3111 and the third terminal 3211 are connected to a circuit, such that the first matching unit 31 and the second matching unit 32 are connected in parallel to the circuit. If the first terminal 3111 and the third terminal 3211 are connected to a voltage source, the first transistor 312 or the second transistor 322 is switched on according to the voltage source and the external voltage source. If the first transistor 312 and second transistor 322 are switched on within different bias voltages, the resistance values will be different, and thus the first transistor 312 and the second transistor 322 may be considered as variable resistors for actively matching an impedance of a load, and the load may be a laser diode (LD) or an elector-absorption modulated laser (EML).

The voltage source may be a periodic wave voltage source, such as a sine wave voltage source, a square wave voltage source or a triangle wave voltage source for outputting a voltage with output high level (VOH) or a voltage with output low level (VOL) by defining the working voltage $V_{TT}$ as an amplitude origin. If the voltage source is situated at a period of a positive half cycle, the voltage source will drive the first matching unit 31. If the voltage source is situated at a period of a negative half cycle, the voltage source will drive the second matching unit 32. If the voltage source is situated at a working voltage $V_{TT}$, one end of the circuit has the same electric potential of the working voltage $V_{TT}$, and thus there will be no loss of DC current.

The active back-end termination circuit 3 may also be connected to the output stage circuit 2 as shown in FIGS. 9 and 11. Now, the active back-end termination circuit 3 replaces the active back-end termination unit 1. The external voltage source is used and connected to the first gate of the first transistor 312 and the second gate of the second transistor 322, and the first transistor 312 and the second transistor 322 generate corresponding impedance values at different bias voltages for actively matching the impedance of the load.

Figure 14:
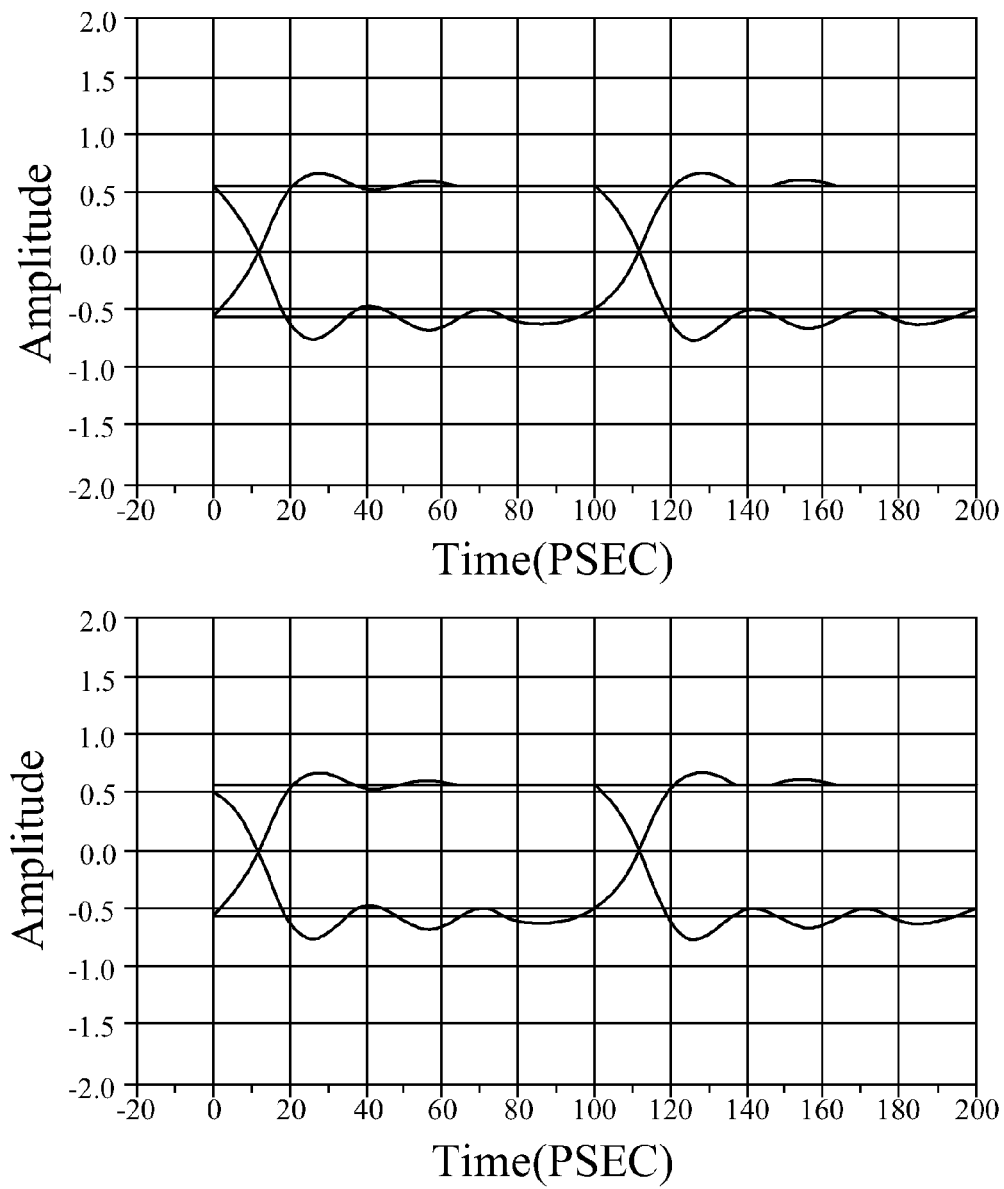
FIG. 14 is an eye diagram of a conventional passive back-end termination connected to an output stage circuit in 25 ohm driving system.
Figure 15:
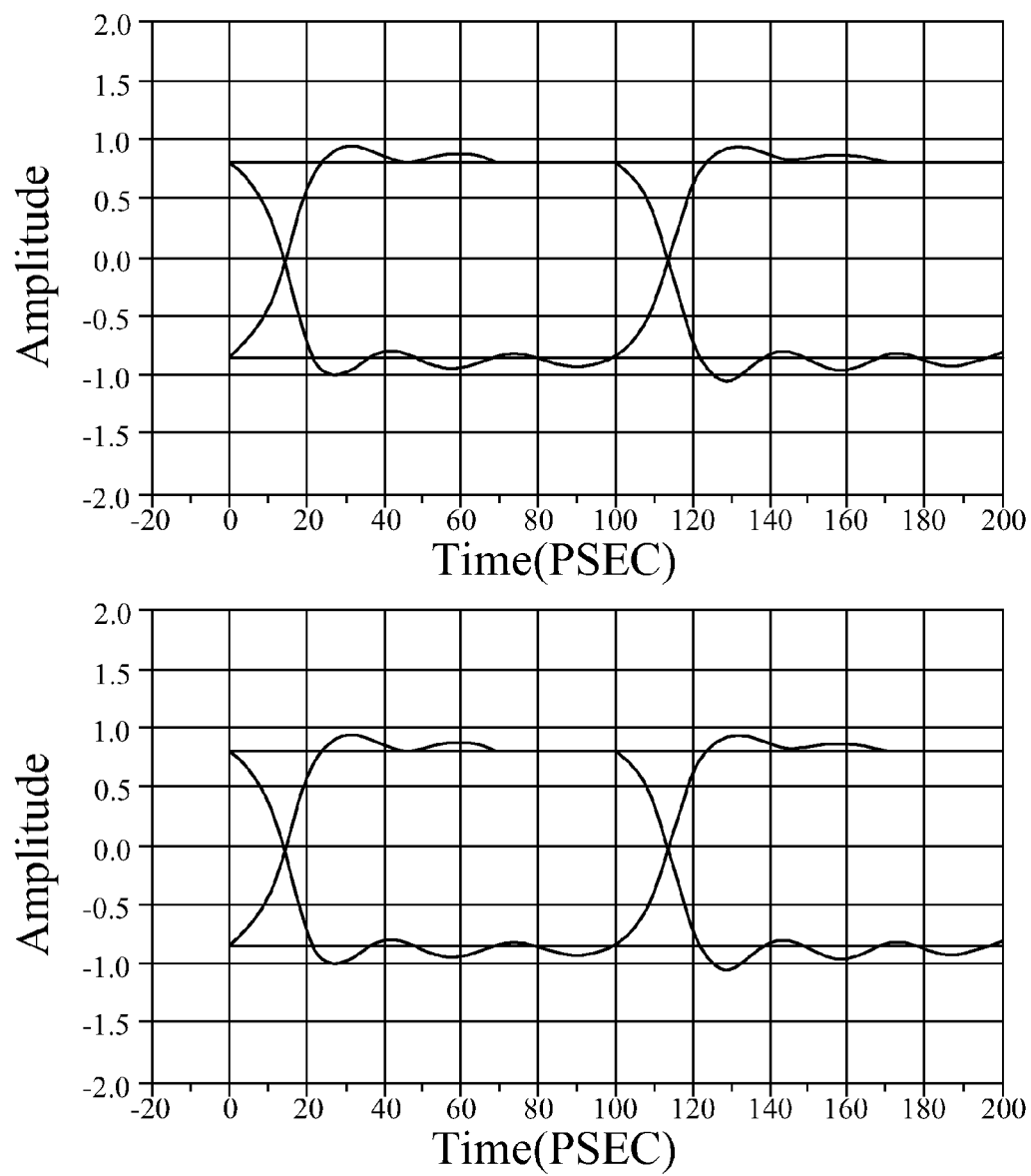
FIG. 15 is an eye diagram of a DC-coupled active back-end termination connected to an output stage circuit in 25 ohm driving system in accordance with the present invention.

With reference to FIG. 14 for an eye diagram of a conventional passive back-end termination circuit in 25-ohm driving system and FIG. 15 for an eye diagram of a DC-coupled active back-end termination circuit in 25 ohm driving system in accordance with the present invention, the amplitude of the prior art ranges from −0.55 to 0.55, and the amplitude of the present invention ranges from −0.84 to 0.83. Obviously, the range of amplitudes of the present invention is greater than the range of amplitudes of the prior art, indicating that the present invention has a wider range of operating voltages to achieve a better driving efficiency and provide a better waveform quality.

Figure 16:
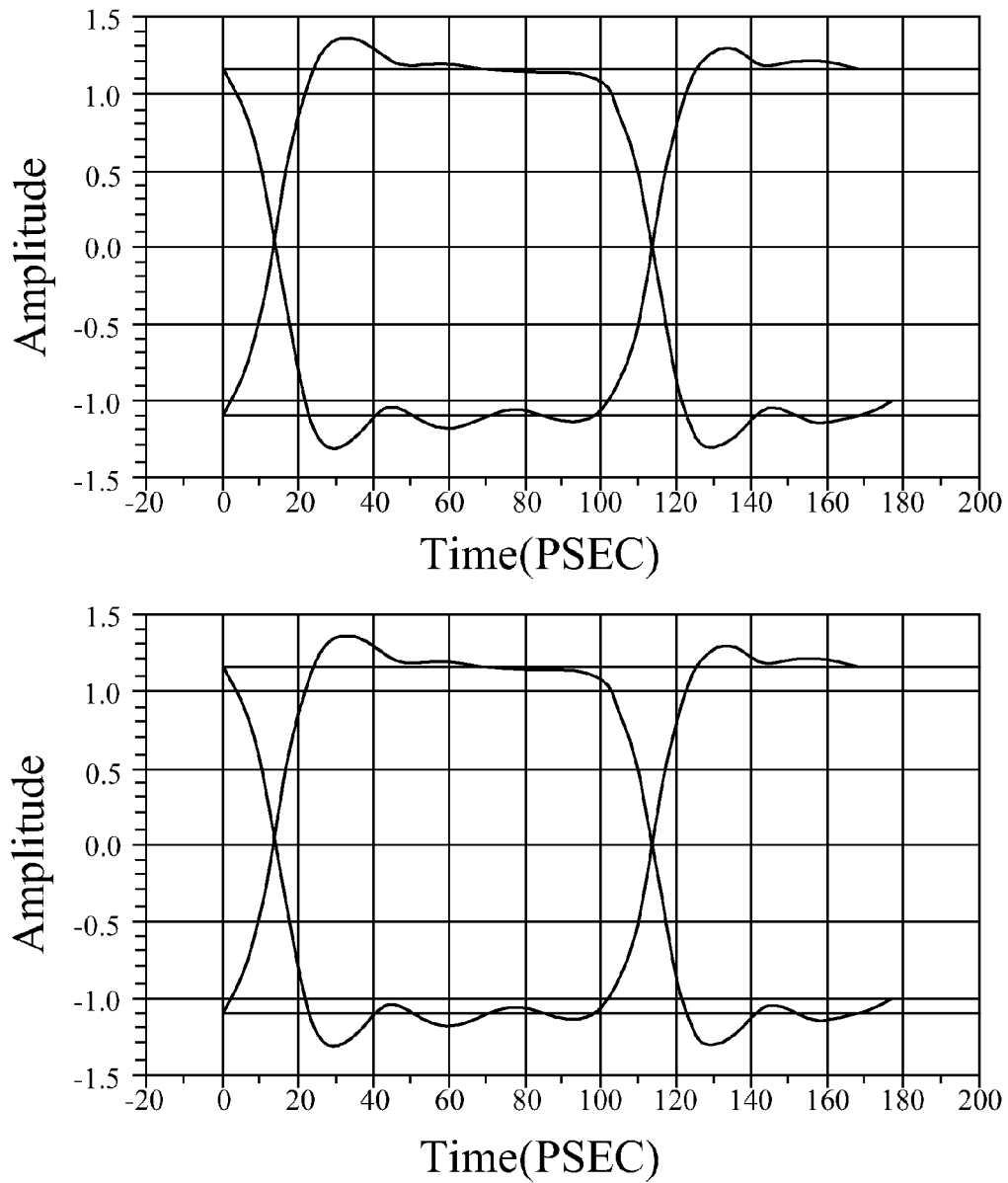
FIG. 16 is an eye diagram of a conventional passive back-end termination circuit connected to an output stage in 50 ohm driving system.
Figure 17:
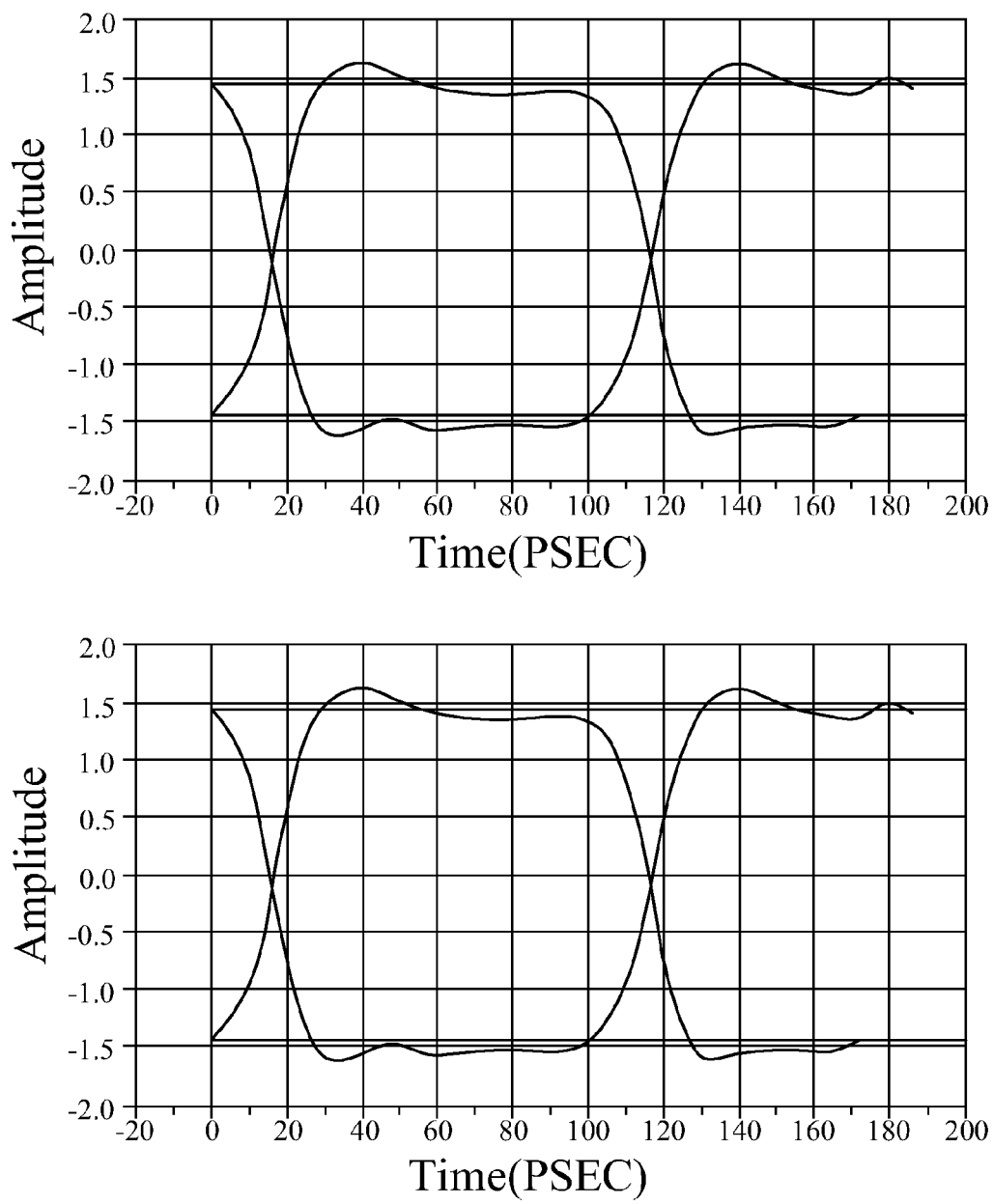
FIG. 17 is an eye diagram of a DC-coupled active back-end termination circuit connected to an output stage in 50 ohm driving system in accordance with the present invention.

With reference to FIG. 16 for an eye diagram of a conventional passive back-end termination circuit in 50 ohm driving system, and FIG. 17 for an eye diagram of an active DC-coupled back-end termination circuit in 50 ohm driving system in accordance with the present invention respectively, the range of amplitudes of the prior art is from −1.159 to 1.053, and the range of amplitudes of the present invention is from −1.429 to 1.481. Obviously, the range of amplitudes of the present invention is greater than the range of amplitudes of the prior art, indicating that the invention has a wider range of operating voltages to achieve a better driving efficiency and provide a better waveform quality.

While the invention has been described by means of specific embodiments, numerous modifications and variations could be made thereto by those skilled in the art without departing from the scope and spirit of the invention set forth in the claims.

What is claimed is:

1. An active back-end termination circuit, comprising:
a first resistor including a first terminal and a second terminal;
a first transistor including a first source, a first gate and a first drain, and the first gate and the first drain being connected to the second terminal, and a matching unit being formed by connecting the first resistor and the first transistor in series, and the first source being connected to a working voltage $V_{TT}$;
a second resistor including a third terminal and a fourth terminal; and
a second transistor including a second source, a second gate and a second drain, and the second source being connected to the fourth terminal, and a second matching unit being formed by connecting the second resistor and the second transistor in series, and the second gate and the second drain being connected to the working voltage $V_{TT}$;
wherein, the first matching unit and the second matching unit are connected to a circuit in parallel by connecting the first terminal and the third terminal to the circuit in parallel; and
wherein, the first transistor or the second transistor is applied with a bias voltage by connecting the first terminal and the third terminal to a voltage source, and an impedance of the first matching unit and the second matching unit are changed actively according to the voltage source for matching a load.

2. The active back-end termination circuit of claim 1, wherein the circuit is an output stage circuit.

3. The active back-end termination circuit of claim 1, wherein the voltage source is a periodic wave voltage source.

4. The active back-end termination circuit of claim 3, wherein the periodic wave voltage source is a sine wave voltage source, a square wave voltage source or a triangle wave voltage source.

5. The active back-end termination circuit of claim 1, wherein the voltage source drives the first matching unit if the voltage source is situated at a period of a positive half cycle, and the voltage source drives the second matching unit if the voltage source is situated at a period of a negative half cycle.

6. The active back-end termination circuit of claim 1, wherein the voltage source outputs a voltage with output light level ($V_{OH}$) or a voltage with output low level ($V_{OL}$) by defining the working voltage $V_{TT}$ as an amplitude origin.

7. The active back-end termination circuit of claim 6, wherein the first transistor or the second transistor provides an impedance matching according to the bias voltage, if the voltage source outputs the voltage with output high level (VOH) or the voltage with output low level (VOL).

8. The active back-end termination circuit of claim 1, wherein the voltage source outputs the working voltage $V_{TT}$ without any loss of DC current.

9. The active back-end termination circuit of claim 1, wherein the load is a laser diode (LD) or an elector-absorption modulated laser (EML).

10. The active back-end termination circuit of claim 1, wherein the first transistor or the second transistor is an N-type metal oxide semiconductor (NMOS), a P-type metal oxide semiconductor (PMOS) or a bipolar junction transistor (BJT).

11. The active back-end termination circuit of claim 1, wherein the active back-end termination circuit and another active back-end termination circuit are connected in parallel to change an equivalent impedance for impedance matching.

12. An active back-end termination circuit, comprising:
a first resistor including a first terminal and a second terminal;
a first transistor including a first source, a first gate and a first drain, and the first drain being connected to the second terminal, and a matching unit being formed by connecting the first resistor and the first transistor in series, and the first source being connected to a working voltage $V_{TT}$, and the first gate being connected to an external voltage source; and
a second resistor including a third terminal and a fourth terminal;
a second transistor including a second source, a second gate and a second drain, and the second source being connected to the fourth terminal, and a second matching unit being formed by connecting the second resistor and the second transistor in series, and the second drain being connected to the working voltage $V_{TT}$, and the second gate being connected to the external voltage source;
wherein, the first matching unit and the second matching unit are connected to a circuit in parallel by connecting the first terminal and the third terminal to the circuit in paralleled; and
wherein, the first transistor or the second transistor is applied with a bias voltage by connecting the first terminal and the third terminal a voltage source, and an impedance of the first matching unit and the second matching unit are actively changed according to the voltage source for matching a load.

13. The active back-end termination circuit of claim 12, wherein the circuit is an output stage circuit.

14. The active back-end termination circuit of claim 12, wherein the voltage source is a periodic wave voltage source.

15. The active back-end termination circuit of claim 14, wherein the periodic wave voltage source is a sine wave voltage source, a square wave voltage source or a triangle wave voltage source.

16. The active back-end termination circuit of claim 12, wherein the voltage source drives the first matching unit if the voltage source is situated at a period of a positive half cycle, and the voltage source drives the second matching unit if the voltage source is situated at a period of a negative half cycle.

17. The active back-end termination circuit of claim 12, wherein the voltage source outputs a voltage with output high level (VOH) or a voltage with output low level (VOL) by defining the working voltage $V_{TT}$ as an amplitude origin.

18. The active back-end termination circuit of claim 17, wherein the first transistor and the second transistor will provide an impedance matching according to the bias voltage, if the voltage source outputs the voltage with output high level (VOH) or the voltage with output low level ($V_{OL}$).

19. The active back-end termination circuit of claim 12, wherein the voltage source outputs the working voltage $V_{TT}$ without any loss of DC current.

20. The active back-end termination circuit of claim 12, wherein the load is a laser diode (LD) or an elector-absorption modulated laser (EML).

21. The active back-end termination circuit of claim 12, wherein the first transistor or the second transistor is an N-type metal oxide semiconductor (NMOS), a P-type metal oxide semiconductor (PMOS) or a bipolar junction transistor (BJT).

22. The active back-end termination circuit of claim 12, wherein the active back-end termination circuit and another active back-end termination circuit are connected in parallel to change an equivalent impedance for impendance matching.

* * * * *